United States Patent [19]
Slee et al.

[11] Patent Number: 4,902,868
[45] Date of Patent: Feb. 20, 1990

[54] ADVANCED PARALLEL SEAM-SEALING SYSTEM

[76] Inventors: Robert K. Slee, Wren Ct. London Rd., Bromley, Kent BR1 1WF, England; James L. Kern, 3134 Deerfield La., Murrysville, Pa. 15668

[21] Appl. No.: 129,145
[22] Filed: Dec. 7, 1987
[51] Int. Cl.⁴ .............................................. B23K 11/32
[52] U.S. Cl. .................................... 219/86.7; 219/79; 219/82; 219/86.25
[58] Field of Search .................. 219/78.01, 79, 80, 82, 219/86.25, 86.7, 87

[56] References Cited

U.S. PATENT DOCUMENTS

| | | | |
|---|---|---|---|
| 3,083,291 | 3/1963 | Soffa et al. | 219/158 |
| 3,193,657 | 7/1965 | Gebauer | 219/78.01 |
| 3,239,644 | 3/1966 | Nyborg et al. | 219/80 |
| 3,392,256 | 7/1968 | Bradham | 219/79 |
| 3,449,540 | 6/1969 | Yanko et al. | 219/80 |
| 3,665,148 | 5/1972 | Yasenchak et al. | 219/80 |
| 4,724,294 | 2/1988 | Klein | 219/87 |

Primary Examiner—Clifford C. Shaw
Attorney, Agent, or Firm—H. Keith Hauger

[57] ABSTRACT

An advanced parallel seam-sealing system which includes a control console, computer deck, electronic keyboard and welding robot for automatically sealing electronic and other component packages. The welding robot is designed to have seven (7) degrees of motion. Parallel arms having roller electrodes move independent of each other in horizontal and rotational directions to continuously operate on a package or matrix of packages which are supported on a rotary table that has vertical, longitudinal and rotary motion.

Six of the motions are driven through computer programmed commands and the vertical rotary table motion is electromechanically controlled and represents the seventh degree of motion. The multiple degrees of freedom allow the system to be used for sealing of multiple arrays of packages by this parallel seam-sealing technique, in a reliable, precise and fast operation.

9 Claims, 3 Drawing Sheets

ADVANCED PARALLEL SEAM-SEALING SYSTEM

BACKGROUND OF THE INVENTION

1. FIELD OF THE INVENTION

This invention relates generally to automatically sealing component packages, including but not limited to, delicate electronic components.

2. DESCRIPTION OF THE PRIOR ART

American and foreign industry and manufacturing have emerged into an electronics' dominated era. All aspects of our personal and business lives are effected by the widespread use of electronic products and computers. It has been discovered that the effective lives of electronic components can be increased substantially if they are operated in water-free and oxygen-free atmospheres. For this reason, certain electronic components have been hermetically sealed in miniature housings or packages containing oxygen- and water-free gases in order to make them suitable for use in applications wherein maximum component reliability is essential. For example, many of the electrical components used in guidance systems for missiles and other types of aircraft are hermetically sealed in packages containing water-free and oxygen-free gases for this reason. In most cases, packages commonly referred to as "flat-pack" packages which commonly have heights up to ¼ inch and sectional dimensions of between ¼ inch and 6 inches are used for containing electronic components. These packages preferably have either round, square or rectangular configurations and have either exclusively metallic or partially metallic and partially ceramic constructions. Generally, the most common types of "flat-pack" packages consist of an open housing-like base portion having a bottom wall and one or more upstanding side walls, and a substantially flat top or lid which is sealed to the upper edges of the base portion side walls to hermetically seal the interior of the package. Exclusively metallic package constructions are sealed by welding the metallic lids thereof directly to the metallic walls of the base portions thereof, whereas ceramic "flat-pack" package constructions are sealed by welding the lids thereof which are normally of metallic construction to metallic upper peripheral frames which are provided on the upper edges of the walls of the otherwise ceramic base portions thereof. Flatpack packages and other ceramic base packages such as side brazed packages are sealed by melting a solder ring between the package lid and a metalized surface on the ceramic base. In either case, however, the sealing of component packages is affected by sealing lids to base portions along peripheral seams of the lids to hermetically encapsulate the interiors of the packages. In this regard, apparatus of the type disclosed in the U.S. Pat. No. 3,239,644 to M. M. Nyborg et al. has been used for performing seam welding operations of this type, although other types of apparatus have also been available for such applications.

U.S. Pat. No. 3,449,540 to Yanko discloses an automatic welding system in which the welding head moves in accordance with plotted coordinates. Numerically controlled and employing an analog X-Y plotter, Yanko is capable of effecting a weld at predetermined positions on a given workpiece.

U.S. Pat. No. 3,665,148 to Yasenchak is a six-axis manipulator operating on a digitally controlled differential gear unit for application in the installation of panels on bodies in the automotive industry. Likewise, of general interest is U.S. Pat. No. 4,577,089 to Olson which illustrates an automatic welding machine comprising a gun that is positioned on a workpiece through magnetic rollers which grip the surface thereof. The position of the workpiece rests on a support plate which may be adjusted by a roller assembly thereunder.

Another U.S. Pat. No. 3,392,256 to Bradham relates to an apparatus for assembling miniature semiconductor networks to an essentially flat printed circuit board. It includes a jig for holding a plurality of miniature electronic network components for connection to a circuit board. The jig comprises a grid having a plurality of openings that coordinate with vertically operating electrodes.

U.S. Pat. #3,083,291 to Soffa is a device for mounting and bonding wafers of semiconductors. This invention operates through a sliding assembly where the wafer is positioned by use of a vacuum needle and examined under a microscope.

Demand in the electronics industry of today is for higher capability in batch processing, optimized sealing mechanisms and minimization of operator procedures. It is noted in the prior art that the seam welding apparatus capability was for receiving a single unit for operation thereon. The invention presented in this application meets the criteria of modern industry.

SUMMARY OF THE INVENTION

It is, therefore, an object of the present invention to provide an advanced parallel seam-sealing system that is a substantial improvement over the prior art in its capability to seal a matrix of packages in a single continuous operation through use of two parallel electrode arms capable of acting independent of each other.

It is a further object of this invention to seal a matrix of packages that may be as close or tight to each other as may be allowed by the relationship between the lid dimensions and the width of the roller wheel electrodes. A nest holds and supports the packages which number from 1 to any desired quantity depending on size of the nest and desired packages which are set forth in an array configuration. One continuous operation performed on multiple packages increases speed by more than two-fold over previous robots.

It is a further object of this invention to minimize the task and movement of an operator who must handle the often very small parts or components while wearing heavy gloves. This increased productivity over the prior art is possible because of the many packages which can be sealed in one continuous operation, resultant in increasing the throughput by more than two times over previous equipment.

It is the further object of the invention to reduce the chances of operational error and assure predictability by use of a totally "menu driven" computer program which does not permit the operator to alter the preprogrammed parameters.

It is the further object of the invention to provide improved robotic operation evidenced in a robot that has seven (7) axes of motion, all of which are electrically controlled. It is noted that each of the parallel electrode arms has two (2) axes of motion that act independent of each other and are positioned by use of stepper motors and screw drives. The independently driven parallel electrode arms make the invention more reliable because each arm is only required to use half the force as before and drive half the weight, thus creating less wear on the machine and its component parts.

It is a further object of the invention to provide a robot that is capable of gently lowering the electrodes onto the package to virtually eliminate the risk of breakage to fragile ceramic, electronic and other packages.

It is a further object of the invention to provide a more reliable automatic seam welder that is capable of performing a true hermetic seal on intricate IC (Integrated Circuits), hybrid and microwave packages through use of extra large heat-sinking electrodes and high pressure. These capabilities permit fusion of upper portions of a package wall with the lid for a true and more reliable weld.

It is the further object of the present invention to provide a versatile automatic seam welder capable of sealing a singular or multiple square, rectangular or other shaped package as well as a metal or ceramic package with metal ring frames. The applicant invention is a welding robot that performs solder reflow sealing on chip carriers and flat-packs (Integrated Circuit packages consisting of a thin, rectangular capsule with pins on each side lying in the plane of the capsule) and on matrices, including but not limited thereto, Kovar (iron-nickel-cobalt alloy used in glass-to-metal seals), Kovar with gold overlay, stainless steel, cold rolled steel, nickel-plated Kovar, nickel, and "combo" lids to metalized ceramic.

It is the further object of the present invention to make a robot having a higher degree of precision over previous machines by using electrodes that are driven with linear motors which provide a higher degree of accuracy than rotary solenoids used in the prior art.

More specifically, the present invention is an advanced parallel seam-sealing system for sealing a matrix of packages in a single operation, comprising a control console having a CRT display for viewing of a menu-driven program, menu select keys for selecting said menu-driven program and controlling electro-mechanical systems of said advanced parallel seamsealing system, AC and DC power supply controls for regulating welding power of said advanced parallel seam-sealing system; a computer deck for insertion therein and running of a disk storing a computer program with package data which controls said electro-mechanical systems of said advanced parallel seam-sealing system, said package data consisting of package dimensions, welding parameters and array configurations which may be viewed on said CRT display; an electronic keyboard connected to said computer deck for keying in said computer programs, said package data, and input data which controls said electro-mechanical systems; a welding robot having seven (7) degrees of motion consisting of right arm latitudinal motion independent of left arm latitudinal motion, right arm rotary motion independent of left arm rotary motion, circumferential rotary table motion, vertical rotary table motion and longitudinal rotary table motion, all of which are controlled by said computer programs, except for vertical rotary table motion; a structural means of supporting and protecting said welding robot and a control means for operation of said electro-mechanical systems of said welding robot.

These objects, as well as other objects and advantages of the present invention, will become apparent from the following description, in reference to the illustrations appended hereto.

BRIEF DESCRIPTION OF THE DRAWINGS

For a better understanding of the invention, reference may be had to the accompanying drawings, in which.

DESCRIPTION OF PREFERRED EMBODIMENTS

Figure 1:
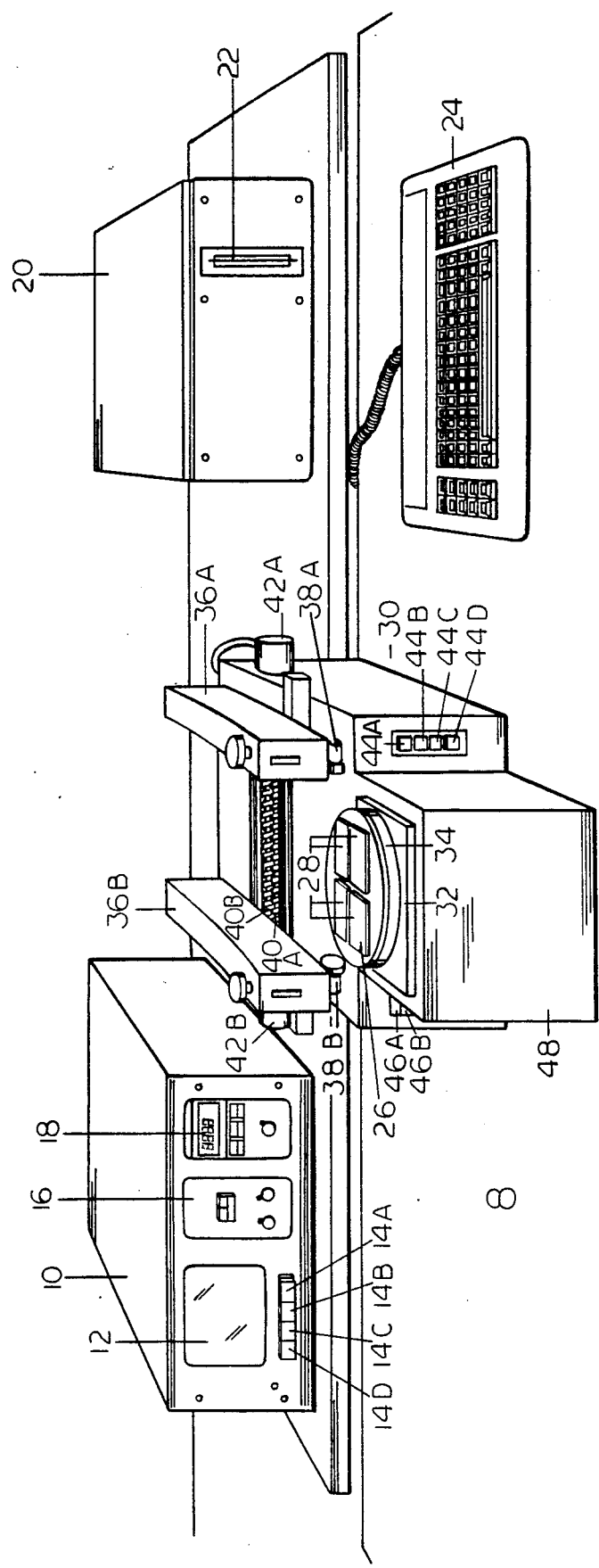
FIG. 1 is a perspective view of an advanced parallel seam-sealing system which includes a display-power supply control console, computer deck, electronic keyboard and welding robot.

Referring to the drawings, FIG. 1 is a perspective view of an advanced parallel seam-sealing system 8, which is controlled by display-power supply control 10. CRT (Cathode Ray Tube) 12 will display various information and data including the appropriate nest data, array configurations and weld supply settings. Menu select keys 14a, 14b, 14c, 14d, enable an operator to select the totally "menu-driven" program and control all relevant computerized operations of this electomechanical system through use of same. Said menu select keys comprise an enter key 14a, a scroll-down key 14b, scroll-up key 14c, and home key 14d. A process engineer is stationed to operate AC synchronus power supply controls 16 which serve to regulate the welding, power and voltage to right roller electrode 38a and in similar fashion to left roller electrode 38b. D.C. capacitive discharge power supply controls 18 regulate the amount of current and energy level at a welding surface of right roller electrode 38a and left roller electrode 38b where it touches packages 26.

Figure 2:
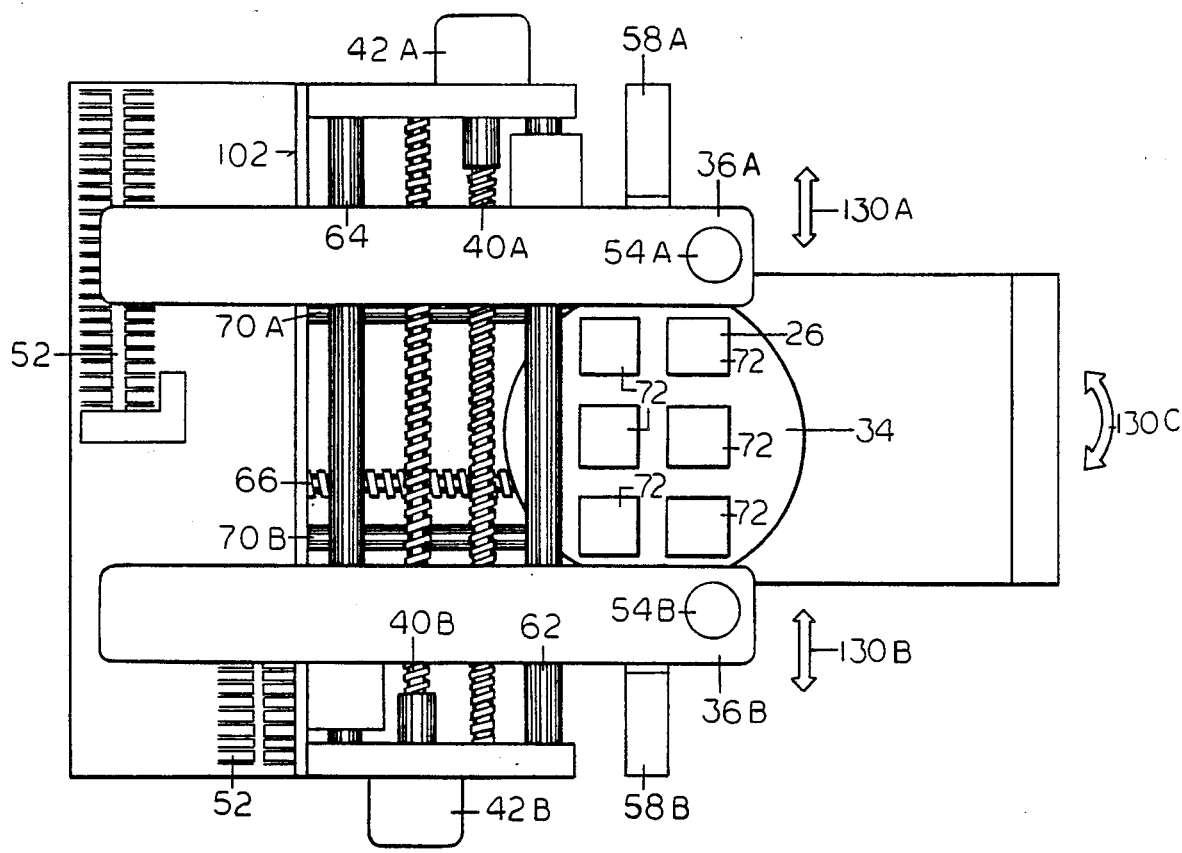
FIG. 2 represents a top view of a welding robot.

Computer deck 20 holds a disk or diskette (not shown) which is inserted at diskette drive 22. Said disk or diskette contains Fortran or other computer programs which are "user friendly" enabling a process engineer to enter or edit package data i.e. dimensions of packages 26 and the array configuration 28 (the arrangement of packages in form and number) which is called for on CRT 12 in menu format. Said parameters and data may be entered or changed by use of keyboard 24. Normally, the operator does not use keyboard 24 but operates the advanced parallel seam-sealing system as aforesaid. Once the parameters are entered by electronic keyboard 24, all axis movements 130a, 130b, 130c, 130d, 130e and 130g (FIGS. 2, 3, 4) are programmed automatically. Motion 130f moves rotary table 32 vertically through use of vertical movement keys 46a for up and 46b for down. The welding robot 30 is capable of the seven (7) axes of motion 130a, 130b, 130c, 130d, 130e, 130f, and 130g, which are electro-mechanically controlled. In particular, the right sliding arm 36a may be independently positioned from the left sliding arm 36b by activating right roller electrode screw drive 40a powered by right D.C. stepping motor 42a and likewise by activating left roller electrode screw drive 40b powered by left D.C. stepping motor 42b. Right D.C. stepping motor 42a and left D.C. stepping motor 42b are linear motors which provide a higher degree of accuracy over previously used rotary solenoids. The motion of right sliding arm 36a is represented by D.C.--in and out movement on the Y axis 130a as shown in FIG. 2 and 4. Likewise, the motion of left sliding arm 36b is represented by D.C.--in and out movement on the Y axis 130b-- as shown in FIG. 2 and 4. Right sliding arm 36a has mounted thereto right roller electrode 38a and left sliding arm 36b has mounted thereto left roller electrode 38b. Right roller electrode 38a receives a power supply through cable 58a and left roller electrode 38b receives a power supply through cable 58b and are respectively positioned on package 26 for seam welding thereto. Welding robot 30 is capable of continuous motion through axis movements 130a, 130b, 130c, 130d, 130e and 130g making it more than twice as fast as other equipment.

Figure 3:
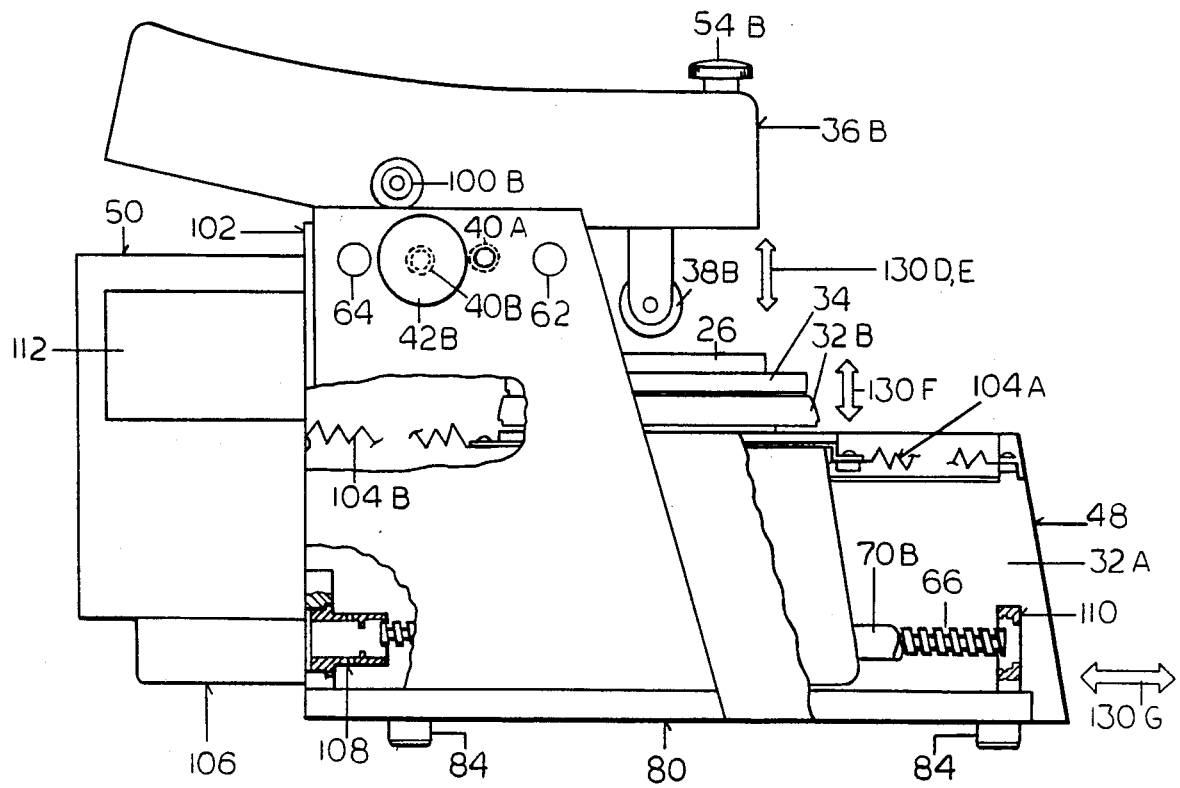
FIG. 3 represents a side elevation view of a welding robot.
Figure 4:
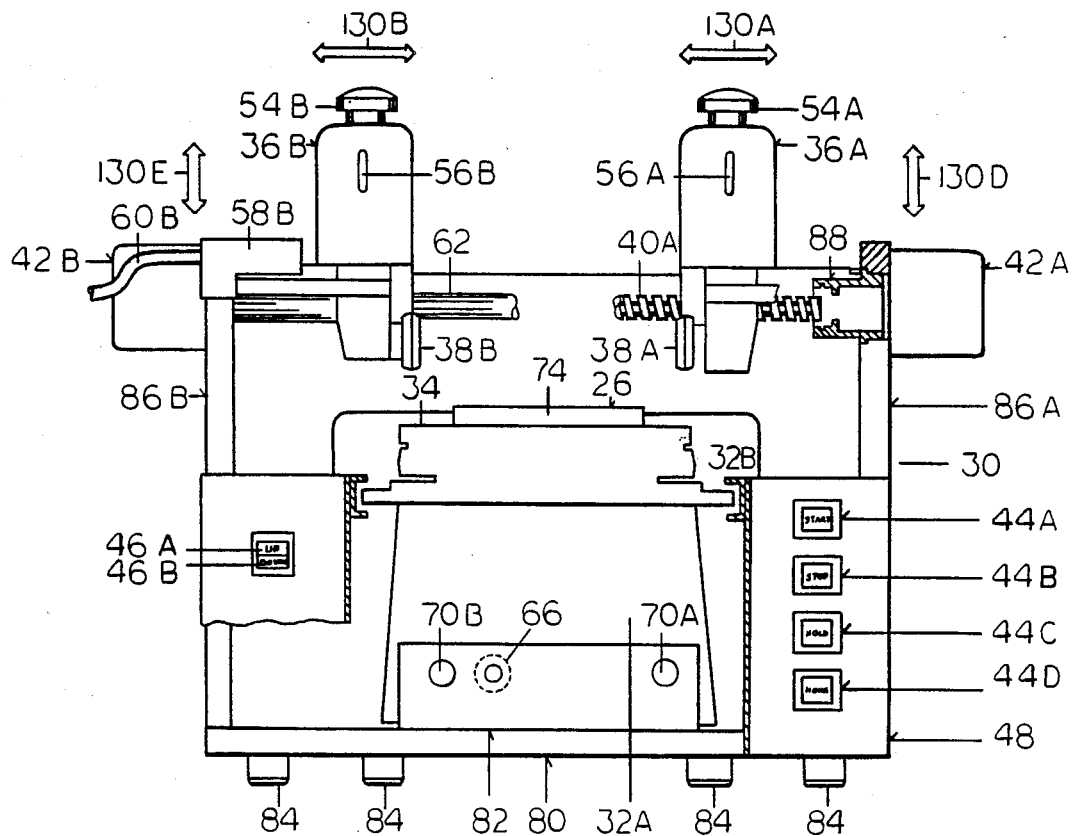
FIG. 4 represents a front elevation view of a welding robot.

Rotary table 32 is comprised of lower rotary table assembly 32b and upper rotary table assembly 32b as shown in FIG. 3 and 4. Rotary table 32 is generally A.C.--driven along its vertical path 130f as aforementioned and shown in FIG. 3. Start--stop electrical controls comprise start switch 44a which initiates the seam weld cycle, stop switch 44b causes an interruption in the sequence of weld operations, hold switch 44c will cause a pause in the sequence of weld operations until touched again, at which time said operations continue and home switch 44d returns the operation back to a 0—0 or beginning coordinate.

Keyboard 24 is used to initially set up system parameters and is capable of calling and coding package files and entering discharge power supply data. It is through keyboard 24 that the array configurations 28 are entered. It is generally not necessary for the operator to utilize keyboard 24 because all operations may then be performed through use of the heretofore mentioned controls like the menu select keys 14a, 14b, 14c, and 14d and the start-stop electrical controls 44a, 44b, 44c and 44d.

Front cover 48 shown in FIG. 1 protects rotary table 32 and the other electro-mechanical component parts located in that general area from dust, dirt and debris. Likewise, rear cover 50 protects the various electromechanical component parts located to the rear of welding robot 30.

The independent action of right sliding arm 36a may be viewed in FIG. 2 along the Y axis shown by movement 130a where forward shaft member 62 and rear shaft member 64 act as guides for movement 130a. Left sliding arm 36b moves along the Y axis with movement 130b and likewise utilizes forward shaft member 62 and rear shaft member 64 as guides for said motion. Greater reliability is obtained in welding robot 30 by use of right sliding arm 36a and left sliding arm 36b which act independent of each other thus driving less weight and extending the life of the component parts of robot 30. Forward shaft member 62 and rear shaft member 64 act as carriages for right sliding arm 36a and left sliding arm 36b and are preferably made of aluminum casting.

Right sliding arm 36a and left sliding arm 36b rotate about respective pivotal axes 100a (not shown) and 100b shown in FIG. 3 to provide degrees of motion respectively 130d and 130e around said Y axis as shown in FIG. 3 and 4. Motion 30d and motion 130e provide approximately 15 degrees of arc motion in Y-Z plane about pivotal axes 100a (not shown) and 100b accomplished through a motor, actuator and drive assembly located inside right electrode arm assembly 36a and left electrode arm assembly 36b but not shown in the drawings. Upper rotary table assembly 32b revolves in rotary fashion on the X-Y plane about the Z axis with motion 130c shown on FIG. 2 through use of a motor and drive assembly not shown. Vertical up and down motion along the Z axis shown as motion 130f moves upper rotary table assembly 32b through use of a motor and drive assembly not shown.

Lower rotary table assembly 32a shown in FIG. 3 moves forward and backward along the X axis shown as motion 130g, through use of a screw drive 66, right shaft member 70a and left shaft member 70b for guidance and rear D.C. stepper motor 106. Support is given to screw drive 66 by front bearing assembly 110 and rear bearing assembly 108.

Front retractable gaiter 104a, made of a flexible material, expands and retracts with motion 130g. Likewise, rear retractable gaiter 104b expands and retracts with motion 130g. Both front retractable gaiter 104a and rear retractable gaiter 104b prevent debris, operator hands and other obstacles from entering welding robot 30.

An electrical terminal board 52 is located to the rear of the welding robot 30 to accept incoming and outgoing leads (not shown) that comprise the electrical network of welding robot 30. Terminal plate assembly 112 viewed in FIG. 3 houses electrical inner connections of welding robot 30 and provides access to electrical terminal board 52.

Knob 54a is used to adjust the pressure of right roller electrode 38a and knob 54b is used to adjust the pressure of left roller electrode 38b. Knob 54a and knob 54b add capability to welding robot 30 for gently lowering right roller electrode 38a and left roller electrode 38b to package 26 in array configuration 28 and in essence provide fine tuning to the delicate operation of seamsealing the heretofore mentioned fragile packages. The point indicators 56a and 56b respectively indicate pressure being exerted on package 26.

Base 80 supported on a multitude of feet 84 act to support welding robot 30 as shown in FIG. 3 and FIG. 4. Front shaft support 82 rests on base 80 and supports screw drive 66, right shaft member 70a and left shaft member 70b. Right hand side plate 86a shown in FIG. 4 acts as a primary support for the right side structure of welding robot 30 and likewise left hand side plate 86b acts as a primary support for the left side structure of welding robot 30 and are joined in the rear by back plate 102 which adds further support to the construction of welding robot 30.

Right bearing--coupling assembly 88 supports right roller electrode screw drive 40a which is driven by right D.C. stepping motor 42a and independently moves right electrode arm assembly 36a through motion 130a. Similarly, left bearing--coupling assembly (not shown) supports left roller electrode screw drive 40b which is driven by left D.C. stepping motor 42b to independently move left electrode arm assembly 36b through motion 130b.

The relative position of rear shaft member 64, forward shaft member 62, right roller electrode screw drive 40a and left roller electrode screw drive 40b are shown in FIG. 2 and FIG. 3. Likewise, the relative position of right shaft member 70a, left shaft member 70b and front to back screw drive 66 is shown in FIG. 3 and FIG. 4.

Figure 5:
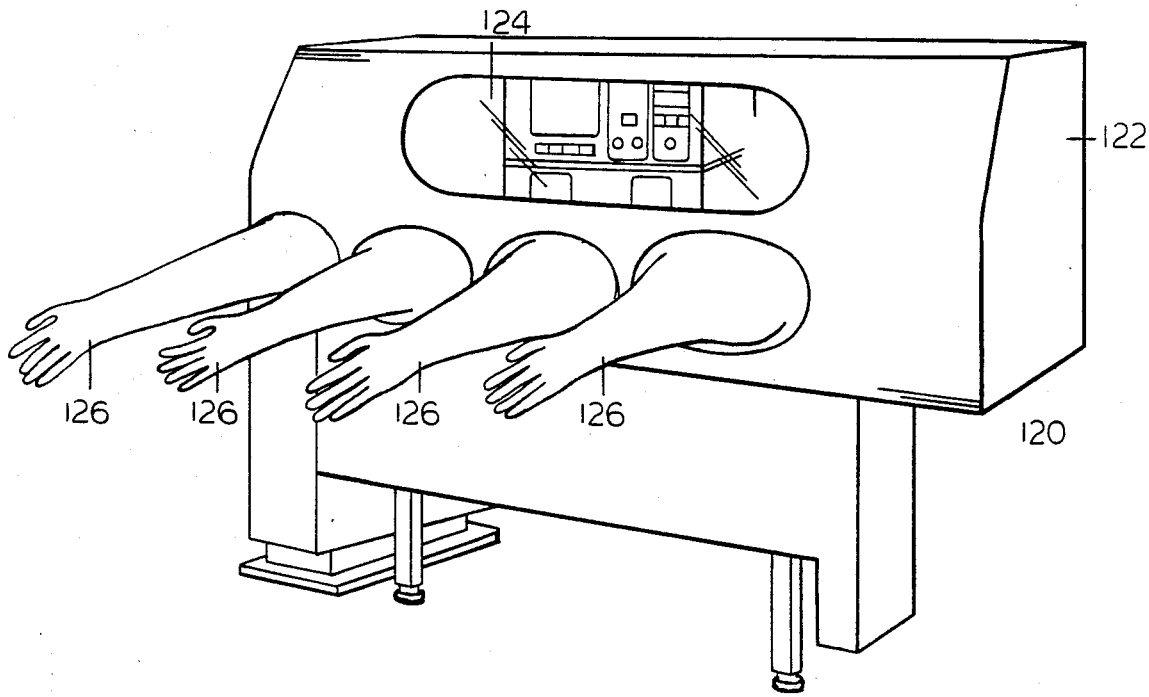
FIG. 5 represents a perspective view of an advanced parallel seam-sealing system enclosed in a glovebox apparatus.

The advanced parallel seam-sealing system 8 is contained in a water-free, oxygen-free atmosphere in glove box 120 for ideal sealing conditions and for extension of the life of electronic components as shown in FIG. 5. The glove box 120 assures the interior of package 26, usually being an electronic component, adequate protection from moisture and oxygen and consists of an air-tight housing 122, a viewing window 124 enabling an operator to operate the advanced parallel seamsealing system 8 through use of a series of gloves 126. Glove box 120 is heat treated and purged to remove moisture before placing packages 26 therein. Glove box 120 is then pressurized with a non-oxygen gas, preferably nitrogen, to an inside pressure that is approximately 3 or 4 inches of water greater than the surrounding atmosphere.

Welding robot 30 may be operated by inserting a hand into glove 126 wherein display--power supply control 10, and start--stop controls 44a, 44b, 44c, and 44d and vertical movement keys 46a and 46b may be manipulated along with the other components of the advanced parallel seam-sealing system 8.

FIG. 1 shows an array configuration 28 consisting of four (4) packages 26. FIG. 4 depicts nest 34 supporting single package 26 representing a single array configuration 74. Thus, array configuration 28 and array configuration 74 are merely examples of two possible array configurations, others comprising 1, 2, 3 . . . n possibilities. Another example is depicted in FIG. 2 where nest 34 is shown having 6 packages 26 for a 6 array configuration 72.

Advanced parallel seam-sealing system 8 incorporates existing technology in its computer system design. The hardware comprises well-known mechanical and electromechanical components which are not shown in the drawings but are located in glove box 120 and are controlled by computer deck 20 which acts as the master computer thereto. The software consists of Fortran or other well-known program languages which are stored on a disk or diskette and inserted into computer deck 20. Computer deck 20 runs the software when an operator makes a selection from keyboard 24 from the various menu of tasks viewed on CRT 12 of welding robot 30. Upon execution of said program, this computer system causes welding robot 30 to operate in performance of its various functions including axis movements 130a, 130b, 130c, 130d, 130e, 130g and coordinating weld power supply as required and necessary.

In accordance with the provisions of the Patent Statutes, we have explained the principal and operation of our invention and have illustrated and described what we consider to represent the best embodiment thereof.

We claim:

1. An advanced parallel seam-sealing system for sealing a matrix of packages in a single operation comprising:

A control console having a CRT display for viewing of a menu-driven program, menu select keys for selecting said menu-driven program and controlling electro-mechanical systems of said advanced parallel seam-sealing system, AC and DC power parallel seam-sealing system;

A computer deck for inserting therein and running of a disk storing a computer program with package data which controls said electro-mechanical system of said advanced parallel seam-sealing system, said package data consisting of package dimensions, welding parameters and array configurations which may be viewed on said CRT display;

An electronic keyboard connected to said computer deck for keying in said computer programs, said package data, and input data which controls said electro-mechanical systems;

A welding robot having seven (7) degrees of motion consisting of a right arm latitudinal motion independent of a left arm latitudinal motion, right arm rotary motion independent of left arm rotary motion, circumferential rotary table motion, vertical rotary table motion and longitudinal rotary table motion, all of which are controlled by said computer programs, except for said vertical rotary table motion;

A structural means of supporting and protecting said welding robot;

A control means for operation of said electromechanical systems of said welding robot.

2. An advanced parallel seam-sealing system for sealing a matrix of packages in a single operation, comprising:

A control console having a CRT display for viewing of a menu-driven program, menu selects keys for selecting said menu-driven program and controlling electro-mechanical systems of said advanced parallel seam-sealing system, AC and DC power supply controls for regulating welding power of said advanced parallel seal-sealing system;

A computer deck for insertion therein and running of a disk storing a computer program with package data which controls said electro-mechanical systems of said advanced parallel seam-sealing system, said package data consisting of package dimensions, welding parameters and array configurations which may be viewed on said CRT display;

An electronic keyboard connected to said computer deck for keying in said computer programs, said package data, and input data which controls said electro-mechanical systems;

A welding robot having a right sliding arm that slides through right arm latitudinal motion on a Y axis and rotates through right arm rotary motion about said Y axis parallel to and independent of a left sliding arm that slides through left arm latitudinal motion on said Y axis and rotates through left arm rotary motion about said Y axis; said right arm latitudinal motion, left arm latitudinal motion, right arm rotary motion and left arm rotary motion controlled by interfacing said computer deck with said electro-mechanical systems; said right sliding arm and said left sliding arm supported and directed by a first shaft guide means and a second shaft guide means;

A rotary table for support to a nest whereon said matrix of packages are placed; said rotary table having an upper rotary table section to support said nest and having vertical rotary table motion on a Z axis, circular rotary table motion through an X-Y plane and a lower rotary table section which slides along longitudinal rotary table motion on an X axis, said lower rotary table motion on an X axis, said lower rotary table section supported and directed on said X axis by a third shaft guide means and fourth shaft guide means; said circular rotary table motion controlled by interfacing said computer deck with said electro-mechanical systems;

A structural means of supporting and protecting said welding robot;

A control means for operation of said electromechanical systems of said welding robot.

3. An advanced parallel seam-sealing system according to claim 2:

Wherein said right sliding arm of said welding robot comprises a right Y axis power means, a right Y axis drive means and a right roller electrode attached to a front lower point of said right sliding arm for receiving weld current from a power source and said left sliding arm of said welding robot comprises a left Y axis power means, a left Y axis drive means and a left roller electrode attached to a front lower point of said left sliding arm for receiving weld current from a power source.

4. An advanced parallel seam-sealing system according to claim 3, wherein:

Said welding power is continuously supplied to said right roller electrode and to said left roller electrode enabling said welding robot to continuously seal said package or plurality of said packages in said single operation, through continuous motion of said right sliding arm, said left sliding arm in coordination with said rotary table which rotates in said X-Y plane and slides on said X axis as controlled by said menu-driven program.

5. An advanced parallel seam-sealing system according to claim 3, wherein:

Said right Y axis power means is a linear motor and said left Y axis power means is a linear motor.

6. An advanced parallel seam-sealing system according to claim 3:

Wherein said right sliding arm houses therein a right inner power means, actuator and drive means for rotating said right sliding arm through said right arm rotary motion about a right pivotal axis means located on said Y axis and wherein said left sliding arm houses therein a left inner power means, actuator and drive means for rotating said left sliding arm through said left arm rotary motion about a left pivotal axis means located on said Y axis.

7. An advanced parallel seam-sealing system according to claim 2:

Wherein said upper rotary table section houses therein a first power means and a first drive means for producing said vertical rotary table motion on said Z axis and a second power means and a second drive means for producing said circumferential rotary table motion on and through said X-Y plane;

Wherein said upper rotary section supports said package or said plurality of said packages arranged in said array configuration where said package is sealed by positioning said right roller electrode and said left roller electrode precisely through said seven (7) degrees of motion to said package or said array configuration of said packages.

8. An advanced parallel seam-sealing system according to claim 2:

Wherein said structural means consists of a base supported by a plurality of feet; a right side structural member supporting right sliding arm bearing means and a left side structural member supporting left sliding arm bearing means; a front structural support member supporting a third front bearing means for supporting said third drive means; a rear structural support member for supporting a third rear bearing means for supporting said third drive means; a front cover for protecting said welding robot; a rear cover for protecting said welding robot; a retractable, protective cover that extends and retracts with said longitudinal rotary table motion.

9. An advanced parallel seam-sealing system according to claim 2 further comprising:

A glove box pressurized with a non-oxygen gas to assure said package is oxygen-free and water-free, wherein said advanced parallel seam-sealing system is housed, said glove box consisting of a housing, viewing window and a plurality of gloves for operation of said advanced parallel seam-sealing system.

* * * * *